(12) United States Patent
Iida et al.

(10) Patent No.: US 6,274,389 B1
(45) Date of Patent: Aug. 14, 2001

(54) MOUNTING STRUCTURE AND MOUNTING PROCESS FROM SEMICONDUCTOR DEVICES

(75) Inventors: Kazutoshi Iida, Kanagawa (JP); Jon Wigham, Dublin (IE); Masaki Watanabe, Shiga; Takeshi Meguro, Ibaraki, both of (JP)

(73) Assignees: Loctite (R&D) Ltd., Dublin (IE); Matsushita Electric Industrial Co. Ltd., Osaka (JP); Loctite Corporation, Rocky Hill, CT (US)

( * ) Notice: Subject to any disclaimer, the term of this patent is extended or adjusted under 35 U.S.C. 154(b) by 0 days.

(21) Appl. No.: 09/341,288

(22) PCT Filed: Jan. 16, 1998

(86) PCT No.: PCT/US98/00856

§ 371 Date: Jul. 8, 1999

§ 102(e) Date: Jul. 8, 1999

(87) PCT Pub. No.: WO98/32159

PCT Pub. Date: Jul. 23, 1998

(30) Foreign Application Priority Data

Jan. 17, 1997 (JP) .................................................. 9-006575

(51) Int. Cl.[7] ............................ H01L 21/00; H01L 21/44; H01L 21/48; H01L 23/48; H01L 23/40
(52) U.S. Cl. ............................... 438/4; 438/108; 438/118; 257/778; 257/783
(58) Field of Search ............................. 438/4, 15, 118, 438/108; 361/767; 257/737, 738, 778, 783

(56) References Cited

U.S. PATENT DOCUMENTS

| | | | |
|---|---|---|---|
| 4,159,976 | 7/1979 | Moran, Jr. ............................ | 260/33.4 |
| 4,181,645 | 1/1980 | Kinoshita ............................. | 260/42.28 |
| 4,866,108 | 9/1989 | Vachon et al. ....................... | 523/428 |
| 5,120,665 | 6/1992 | Tsukagoshi .......................... | 437/8 |
| 5,137,936 | 8/1992 | Akiguchi et al. .................... | 522/170 |
| 5,250,848 | 10/1993 | Christie et al. ...................... | 257/778 |
| 5,274,913 | 1/1994 | Grebe et al. ......................... | 29/843 |
| 5,355,580 | 10/1994 | Tsukada .............................. | 29/840 |
| 5,371,328 | 12/1994 | Gutierrez et al. .................... | 174/258 |
| 5,423,931 | 6/1995 | Inoue et al. ......................... | 156/94 |
| 5,512,613 | 4/1996 | Afzali-Ardakani et al. ......... | 523/443 |
| 5,560,934 | 10/1996 | Afzali-Ardakani et al. ......... | 424/497 |
| 5,567,266 | 10/1996 | Liu ...................................... | 156/310 |
| 5,760,337 | 6/1998 | Iyer et al. ............................ | 174/52.2 |
| 5,783,867 | 7/1998 | Belke, Jr. et al. ................... | 257/783 |
| 5,821,456 | 10/1998 | Wille et al. .......................... | 174/52.2 |
| 5,872,158 | 2/1999 | Kuczynski .......................... | 522/182 |
| 5,912,282 | 6/1999 | Iyer et al. ............................ | 523/176 |
| 5,914,381 | 6/1999 | Terado ................................. | 527/300 |
| 5,932,682 | 8/1999 | Buchwalter et al. ................ | 549/547 |
| 5,973,033 | 10/1999 | Ober et al. .......................... | 523/443 |
| 6,074,895 | * 6/2000 | Dery et al. . | |

FOREIGN PATENT DOCUMENTS

| | | |
|---|---|---|
| 0532896 | 3/1993 | (EP) . |
| 60-147140 | 3/1985 | (JP) . |
| 61-255032 | 12/1986 | (JP) . |
| 05 102 343 | 4/1993 | (JP) . |
| 05-109838 | 4/1993 | (JP) . |
| 05 251 516 | 9/1993 | (JP) . |
| 06 069 280 | 3/1994 | (JP) . |
| 06 077 264 | 3/1994 | (JP) . |
| 6069280 | 3/1994 | (JP) . |
| 10-107095 | 4/1998 | (JP) . |
| WO 99/35187 | 7/1999 | (WO) . |

* cited by examiner

Primary Examiner—David E. Graybill
(74) Attorney, Agent, or Firm—Steven C. Bauman

(57) ABSTRACT

The present invention provides a mounting structure for semiconductor devices which enables a semiconductor device, such as CSP/BGA, to be fixed to a circuit board. This invention also provides a mounting process for semiconductor devices.

19 Claims, 2 Drawing Sheets

MOUNTING STRUCTURE AND MOUNTING PROCESS FROM SEMICONDUCTOR DEVICES

BACKGROUND OF THE INVENTION

1. Field of the Invention

This invention relates to a structure and process for mounting a semiconductor chip, such as large scale integration ("LSI"), on a carrier substrate.

2. Brief Description of Related Technology

In recent years, the popularity of small-sized electronic appliances, such as camera-integrated video tape recorders ("VTRs") and portable telephone sets, has made size reduction of LSI devices desirable. As a result of these reduction desires, chip size or chip scale packages ("CSPs") and ball grid arrays ("BGAs") are being used to reduce the size of packages substantially to that of bare chips. Such CSPs and BGAs improve the characteristics of the electronic device while retaining many of their operating features, thus serving to protect semiconductor bare chips, such as LSIS, and facilitate testing thereof.

Ordinarily, the CSP/BGA assembly is connected to electrical conductors on a circuit board by use of a solder connection or the like. However, when the resulting structure is exposed to thermal cycling, the reliability of the solder connection between the circuit board and the CSP/BGA often becomes suspect. Recently, after a CSP/BGA assembly is mounted on a circuit board, the space between the CSP/BGA assembly and the circuit board is often now filled with a sealing resin (often referred to as underfill sealing) in order to relieve stresses caused by thermal cycling, thereby improving heat shock properties and enhancing the reliability of the structure.

However, since thermosetting resins are typically used as the underfill sealing material, in the event of a failure after the CSP/BGA assembly is mounted on the circuit board, it is very difficult to replace the CSP/BGA assembly without destroying or scrapping the structure in its entirety.

To that end, techniques for mounting a bare chip on a circuit board are accepted as substantially similar to the mounting of a CSP/BGA onto a circuit board. One such technique, disclosed in Japanese Patent Laid-Open No. 102343/93, involves a mounting process where a bare chip is fixed and connected to a circuit board by use of a photocurable adhesive, where, in event of failure, this bare chip is removed therefrom. However, this technique is limited to those instances where the circuit board includes a transparent substrate (e.g., glass) which permits exposure to light from the back side, and the resulting structure exhibits poor heat shock properties.

Japanese Laid-Open Patent Publication No. 69280/94 discloses a process where a bare chip is fixed and connected to a substrate by use of a resin capable of hardening at a predetermined temperature. In the event of failure, this bare chip is removed from the substrate by softening the resin at a temperature higher than the predetermined temperature. However, no specific resin is disclosed, and there is no disclosure about treating the resin which remains on the substrate. Thus, the disclosed process is at best incomplete.

As pointed out in Japanese Patent Laid-Open No. 77264/94, it is conventional to use a solvent to remove residual resin from the circuit board. However, swelling the resin with a solvent is a time-consuming process and the corrosive organic acid ordinarily used as the solvent may reduce the reliability of the circuit board. Instead, that disclosure speaks to a method for removing residual resin by irradiation with electromagnetic radiation.

Japanese Patent Laid-Open No. 251516/93 also discloses a mounting process using bisphenol A type epoxy resin (CV5183 or CV5183S; manufactured by Matsushita Electric Industrial Co., Ltd.). However, the removal process so disclosed does not consistently permit easy removal of the chip, the curing step is lengthy at elevated temperatures, and the process generally results in poor productivity.

Accordingly, it would be desirable to have a mounting structure for semiconductor devices which readily removable in the event a failure is found and a process for fabricating such a structure.

SUMMARY OF THE INVENTION

The present invention provides a mounting structure for semiconductor devices which enables a semiconductor device (such as a CSP/BGA assenbly) which includes a semiconductor chip mounted on a carrier substrate, to be securely connected to a circuit board by short-time heat curing and with good productivity, which demonstrates excellent heat shock properties (or thermal cycle properties), and permits the CSP/BGA assembly to be easily removed from the circuit board in the event of semiconductor device or connection failure. The present invention also provides a method for repairing such a mounting structure.

The mounting structure includes a semiconductor device, which itself includes a semiconductor chip mounted on a carrier substrate, and a circuit board to which the semiconductor device is electrically connected. The space between the carrier substrate of the semiconductor device and the circuit board is sealed with a reaction product of a thermosetting resin composition. This composition includes about 100 parts by weight of an epoxy resin, about 3 to about 60 parts by weight of a curing agent and about 1 to about 90 parts by weight of a plasticizer.

The present invention also relates to a mounting process for a semiconductor device, the steps of which include electrically connecting a semiconductor device to a circuit board; infiltrating a thermosetting resin composition into the space between the carrier substrate of the semiconductor device having a semiconductor chip mounted on a carrier substrate and the circuit board; and curing the thermosetting resin composition by the application of heat.

After the semiconductor device is mounted, the mounting process of the present invention may further include the steps of testing electrical properties of the circuit board on which the semiconductor device is mounted; in the event: of failure in the testing step, removing the semiconductor device at the failure site while heating the neighborhood of the failure site; removing the residue of the reaction product of the thermosetting resin composition from the circuit board or from the bottom of the semiconductor device by heating it to a predetermined temperature, impregnating it with an organic solvent, with or without the application of heat at a predetermined temperature, and removing the residue of the electrically conductive material from the circuit board or from the bottom of the semiconductor device. In this way, the defective part can be repaired.

Although the thermosetting resin composition used in the present invention is curable at a relatively low temperature in a short period of time, cured reaction products thereof exhibit excellent heat shock properties and, moreover, may be easily split by the application of force under heated conditions. Further, the cured reaction products attached to circuit boards and the like may be easily removed by heating, swelling with a solvent, or swelling with a solvent under heated conditions.

By using a thermosetting resin composition, semiconductor devices, such as CSP/BGA assemblies, can be securely connected to a circuit board by short-time heat curing and with good productivity, and the resulting mounting structure has excellent heat shock properties (or thermal cycle properties). Moreover, in the event of failure, the semiconductor device can be easily removed. This facilitates reuse of the semiconductor device or circuit board, thereby achieving an improvement in the yield of the production process and a reduction in production cost.

BRIEF DESCRIPTION OF THE FIGURES

The present invention will be more readily appreciated with reference to the figures which follow.

DETAILED DESCRIPTION OF THE INVENTION

Figure 1:
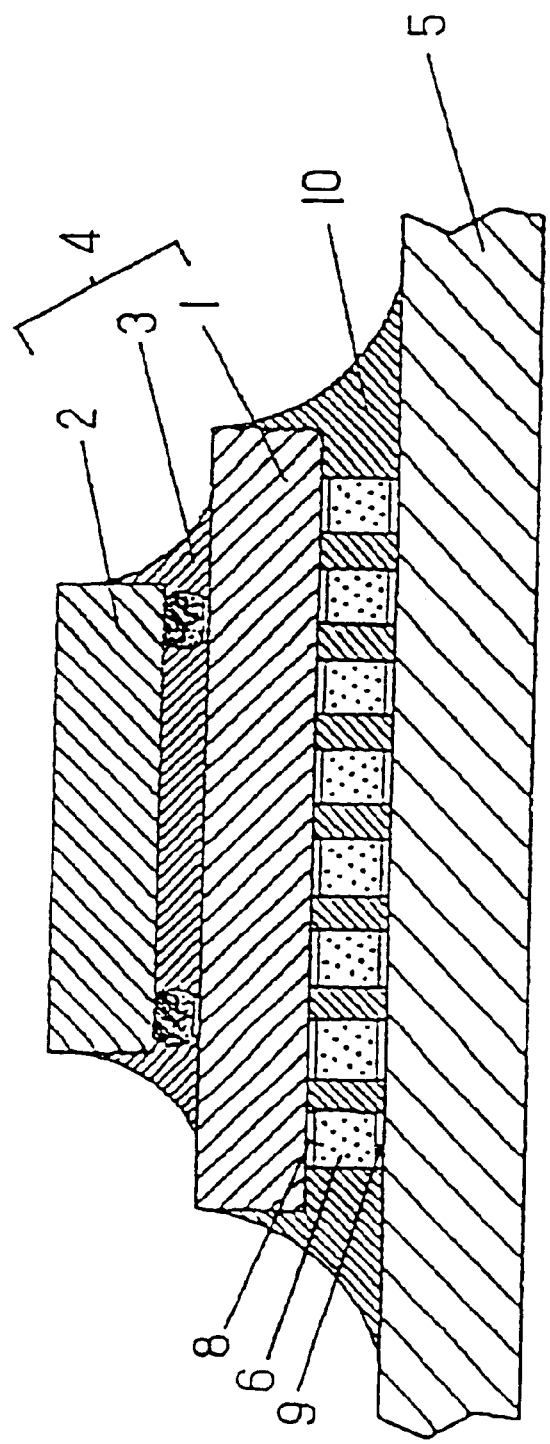
FIG. 1 depicts a cross-sectional view showing an example of the mounting structure of the present invention.

An example of the mounting structure of the present invention is shown in FIG. 1. The semiconductor device 4 used in the present invention is one formed by connecting a semiconductor chip ("bare chip") 2, such as LSI, to a carrier substrate 1 and sealing the space therebetween with resin 3. This semiconductor device is mounted at a predetermined position of the circuit board 5, and electrodes 8 and 9 are electrically connected by a suitable connection means, such as solder. In order to improve reliability, the space between carrier substrate 1 and circuit board 5 is sealed with a thermosetting resin composition which is then cured into a reaction product 10. The cured reaction product 10 of the thermosetting resin composition need not completely fill the space between carrier substrate 1 and circuit board 5, but should fill that space to such an extent as to relieve stresses caused by thermal cycles.

Carrier substrates may be constructed from ceramic substrates made of $Al_2O_3$, $SiN_3$ and mullite ($Al_2O_3$—$SiO_2$); substrates or tapes made of heat-resistant resins such as polyimides; glass-reinforced epoxy, ABS and phenolic substrates which are also used commonly as circuit boards; and the like.

No particular limitation is placed on the means for electrically connecting the semiconductor chip to the carrier substrate, and there may be employed connection by a high-melting solder or electrically (or anisotropically) conductive adhesive, wire bonding, and the like. In order to facilitate connections, the electrodes may be formed as bumps. Moreover, in order to improve the reliability and durability of connections, the space between the semiconductor chip and the carrier substrate may be sealed with a suitable resin.

The semiconductor devices which can be used in the present invention include CSPs and BGAs.

No particular limitation is placed on the type of circuit board used in the present invention, and there may be used any of various common circuit boards such as glass-reinforced epoxy, ABS and phenolic boards.

The thermosetting resin composition which is used as a sealer underfilling between such a semiconductor device and a circuit board to which the semiconductor device is electrically connected, includes about 100 parts by weight of an epoxy resin, about 3 to about 60 parts by weight of a curing agent, and about 1 to about 90 parts by weight of a plasticizer.

The epoxy resin used in the present invention can be any common epoxy resin. This epoxy resin may comprise at least one multifunctional epoxy resin and 0 to 30%, such as 20%, by weight based on the total epoxy resin of at least one monofunctional epoxy resin used as a reactive diluent, or crosslink density modifier.

Examples of the multifunctional epoxy resin include bisphenol A type epoxy resin, bisphenol F type epoxy resin, phenol-novolac type epoxy resin cresol-novolac type epoxy resin and appropriate combinations thereof. Consideration should be given to the viscosity and other properties of the epoxy resin, and ordinarily the multifunctional epoxy resin should include an amount within about the range of 10 to 100%, of bisphenol A type epoxy resin. Desirably, the amount of bisphenol A type resin should be in the range of from about 50 to 100%.

The monofunctional epoxy resin has one epoxy group. Ordinarily, the epoxy group should have an alkyl group of about 6 to about 28 carbon atoms, examples of which include $C_6$–$C_{28}$ alkyl glycidyl ethers, $C_6$–$C_{28}$ fatty acid glycidyl esters and $C_6$–$C_{28}$ alkylphenol glycidyl ethers.

The plasticizer used in the present invention is one which has relatively low volatility as characterized by a boiling point of at least about 130° C. and which lowers the Tg of cured reaction products of the resin. It is desirable to use a plasticizer material which causes microscopic phase separation when the resin is cured. While these materials are referred to herein as plasticizers, they need not perform the function(s) conventionally associated with plasticizers.

Examples of such plasticizers include (meth)acrylic esters, and aromatic or aliphatic esters.

(Meth)acrylic esters useful as plasticizers in this invention include monofunctional (meth)acrylic esters, such as (meth)acrylic esters of straight-chain or branched aliphatic alcohols, (meth)acrylic esters of aliphatic alcohols having an aromatic hydrocarbon substituent group, (meth)acrylic esters of alicyclic alcohols, hydroxyl-containing alkyl (meth)acrylic esters, and (meth)acrylic esters of hydroxy aliphatic amines; and multifunctional (meth)acrylic esters, such as (meth)acrylic esters of polyethers and (meth)acrylic esters of polyhydric epoxy compounds.

(Meth)acrylic esters of straight-chain or branched aliphatic alcohols useful as plasticizers in this invention include those with about 4 to about 16 carbon atoms, such as n-butyl (meth)acrylate, isobutyl (meth)acrylate, t-butyl (meth)acrylate, 2-ethylhexyl (meth)acrylate, n-octyl (meth)acrylate, isodecyl (meth)acrylate, lauryl (meth)acrylate, tridecyl (meth)acrylate, tetradecyl (meth)acrylate and cetyl (meth)acrylate. (Meth)acrylic esters of aliphatic alcohols having an aromatic hydrocarbon substituent group include (meth)acrylic esters of aliphatic alcohols having from 1 to about 8 carbon atoms having an aromatic hydrocarbon substituent group, such as benzyl (meth)acrylate.

(Meth)acrylic esters of alicyclic alcohols useful as plasticizers in this invention include cyclohexyl (meth)acrylate and isobornyl (meth)acrylate.

Hydroxyl-containing alkyl (meth)acrylic esters useful as plasticizers in this invention include hydroxyethyl (meth)acrylate, hydroxypropyl (meth)acrylate and 3-phenoxy-2-hydroxypropyl (meth)acrylate.

(Meth)acrylic esters of hydroxy aliphatic amines useful in this invention include (meth)acrylic esters of amines represented by $NR^1R^2R^3$ where $R^1$, $R^2$ and $R^3$ independently represent hydrogen, alkyl groups, hydroxyalkyl groups or hydro-poly(oxyalkylene) groups, and at least one of $R^1$, $R^2$ and $R^3$ is a hydroxyalkyl group or a hydro-poly (oxyalkylene) group.

Specific examples thereof include (meth)acrylic esters of N,N'-dialkyl-substituted dimonoalkanol amines, such as N,N'-dimethylaminoethyl (meth)acrylate and N,N'-diethylaminoethyl (meth)acrylate; mono- or di(meth)acrylic esters of N-alkyl-substituted dialkanolamines, such as N-ethyl-N'-hydroxyethylaminoethyl (meth)acrylate and ethyldihydroxyethylamine di(meth)acrylate; (meth)acrylic esters of trialkanolamines, such as triethanolamine (meth) acrylate, triethanolamine di(meth)acrylate and triethanolamine tri(meth)acrylate; mixtures of alkanolamine (meth) acrylates which are known generically as acrylated amine oligomers; and (meth)acrylic esters of hydro-poly (oxyalkylenes), such as the (meth)acrylic ester of $(CH_3)_2N-(CH_2CH_2O)_2H$, the mono- or di(meth)acrylic ester of $CH_3N[-(CH_2CH_2O)_2H]_2$, and the mono-, di- or tri(meth) acrylic ester of $N[-(CH_2CH_2O)_2H]_3$.

Particularly desirable ones include compounds within the formula $(HOR^4)_{3-x}N[R^4OCOC(R^5)=CH_2]_x$, where $R^4$ is an alkylene group having from about 2 to about 12 carbon atoms, or $-R^6-(OR^6)_m$ where $R^6$ is $-CH_2CH_2-$ or $-CH_2CH(CH_3)-$ and m is an integer of 1 to 6; $R^5$ is hydrogen or a methyl group; and x is an integer of 1 to 3.

Examples of (meth)acrylic esters of polyethers include ethylene glycol di(meth)acrylate, diethylene glycol di(meth) acrylate, triethylene glycol di(meth)acrylate, tetraethylene glycol di(meth)acrylate, 1,3-butylene glycol di(meth) acrylate and trimethylolpropane tri(meth)acrylate. Examples of the (meth)acrylic esters of polyhydric epoxy compounds include di(meth)acrylic esters of bisphenol A epichlorohydrin reaction products.

Aromatic or aliphatic esters useful as plasticizers in the present invention include dialkyl esters of aromatic carboxylic acids, e.g., di ($C_1-C_{12}$ alkyl)phthalates, such as dimethyl phthalate, diethyl phthalate, di-n-octyl phthalate, di-2-ethylhexyl phthalate and octyl decyl phthalate; aliphatic monobasic acid esters, such as butyl oleate and glycerol mono-oleate; and aliphatic dibasic acid esters, such as dibutyl adipate, di-2-ethylhexyl adipate, dibutyl sebacate and di-2-ethylhexyl sebacate.

Of these plasticizers, (meth)acrylic esters of alkanolamine, or hydro-poly(oxyalkylene)amines as represented by the formula above, di ($C_1-C_{12}$ alkyl) phthalates, hydroxyl-containing alkyl esters of (meth)acrylic acid, and (meth)acrylic esters of alicyclic alcohols are especially desirable.

The plasticizer component is usually used in an amount of 1 to about 90 parts by weight, per 100 parts by weight of the epoxy resin. Desirably, that range is within 5 to 50 parts by weight of the resin.

The thermosetting resin composition of the present invention may be formulated as a one-part composition, in which all the ingredients are mixed together, or as a two-part composition, in which the epoxy resin and the curing agent are stored separately and mixed thereafter prior to use. Accordingly, the curing agent used in the present invention can generally be any of the curing agents which are used in one-part and two-part epoxy resins. However, desirable curing agents for use with the present invention include amine compounds, imidazole compounds, modified amine compounds and modified imidazole compounds.

Examples of the amine compounds include dicyandiamide; aliphatic polyamines, such as diethylenetriamine, triethylenetetramine and diethylaminopropylamine; aromatic polyamines, such as m-xylenediamine and diaminodiphenylamine; alicyclic polyamines, such as isophoronediamine and menthenediamine; and polyamides.

Examples of the imidazole compounds include 2-methyl imidazole, 2-ethyl-4-methylimidazole and 2-phenylimidazole.

Examples of the modified amine compounds include epoxy-added polyamines formed by the addition of an amine compound to an epoxy compound, and examples of the modified imidazole compounds include imidazole adducts formed by the addition of an imidazole compound to an epoxy compound.

Of these curing agents, latent curing agents used in one-pack epoxy resins are particularly desirable. From the viewpoint of repairability, it is especially desirable to use 5 to 95% by weight of a modified amine in combination with 95 to 5% by weight of dicyandiamide, based on the total weight of the curing agent. The curing agent itself is ordinarily used in an amount of from about 3 to about 60 parts by weight, per 100 parts by weight of the epoxy resin. Desirably, that is within 5 to 40 parts by weight of the resin.

It is desirable for the thermosetting resin compositions used in the present invention to contain the aforesaid plasticizer and monofunctional epoxy resin in a combined amount of about 5 to about 40% by weight.

The thermosetting resin compositions according to the present invention are capable of penetrating into the space between the circuit board and the semiconductor device. These inventive compositions also demonstrate a reduced viscosity, at least under elevated temperature conditions, and thus are capable of penetrating into that space. It is desirable to prepare the thermosetting resin composition by selecting the types and proportions of various ingredients so that its viscosity at 25° C. will be 50,000 mpa·s or less, such as 30,000 mPa·s or less, so as to improve its ability to penetrate into the space (e.g., of 100 to 200 μm) between the circuit board and the semiconductor device.

The thermosetting resin composition of the present invention may further contain other additives, such as defoaming agents, leveling agents, dyes, pigments and fillers. Moreover, photopolymerization initiators may also be incorporated therein, provided that such initiators do not adversely affect the properties of the composition or reaction products formed therefrom.

Next, the mounting process for making the mounting structure of the present invention is described below.

Initially, cream solder is printed at the necessary positions of a circuit board and suitably dried to expel the solvent. Then, a semiconductor device is mounted in conformity with the pattern on the circuit board. This circuit board is passed through a reflowing furnace to melt the solder and thereby solder the semiconductor device.

The electrical connection between the semiconductor device and the circuit board is not limited to the use of cream solder, but may be made by use of solder balls. Alternatively, this connection may also be made through an electrically conductive adhesive or an anisotropically conductive adhesive. Moreover, cream solder or the like may be applied or formed on either the circuit board or the semiconductor device.

In order to facilitate subsequent repairs, the solder, electrically or anisotropically conductive adhesive used should be chosen bearing in mind its melting point, bond strength and the like.

After the semiconductor device is electrically connected to the circuit board in this manner, the resulting structure should ordinarily be subjected to a continuity test or the like. After passing such test, the semiconductor device with a resin composition. In this way, in the event of a failure, it is easier to remove the semiconductor device before fixing it with the resin composition.

Then, using a suitable application means such as dispenser, a thermosetting resin composition is applied to the periphery of the semiconductor device. When this composition is applied to the semiconductor device, it penetrates into the space between the circuit board and the carrier substrate of the semiconductor device by capillary action.

Next, the thermosetting resin composition is cured by the application of heat. During the early stage of this heating, the thermosetting resin composition shows a significant reduction in viscosity and hence an increase in fluidity, so that it more easily penetrates into the space between the circuit board and the semiconductor device. Moreover, by providing the circuit board with suitable venting holes, the thermosetting resin composition is allowed to penetrate fully into the entire space between the circuit board and the semiconductor device.

The amount of thermosetting resin composition applied should be suitably adjusted so as to fill the space between the circuit board and the semiconductor device almost completely.

When the above-described thermosetting resin composition is used, it is usually cured by heating at 120 to 150° C. for a period of time of about 5 to 20 minutes. Thus, the present invention can employ relatively low-temperature and short-time curing conditions and hence achieve very good productivity. The mounting structure illustrated in FIG. 1 is completed in this manner. Where a (meth)acryl ester is used as a plasticizer in the thermosetting resin composition and a photopolymerization initiator is added thereto, the thermosetting resin composition can be tentatively cured by exposure to light prior to heat curing.

In the mounting process of the present invention, after the semiconductor device is mounted on the circuit board as described above, the resulting structure is tested with respect to characteristics of the semiconductor device, connection between the semiconductor device and the circuit board, other electrical characteristics, and the state of sealing. In case that a failure is found, repair can be made in the following manner.

The area around the semiconductor device at the failure site is heated at a temperature of about 190 to about 260° C. for a period of time ranging from about 10 seconds to about 1 minute. Although no particular limitation is placed on the heating means, local heating is preferred. There may be employed a relatively simple means such as the application of hot air to the failure site.

As soon as the solder is melted and the resin is softened to cause a reduction in bond strength, the semiconductor device is pulled apart.

Figure 2:
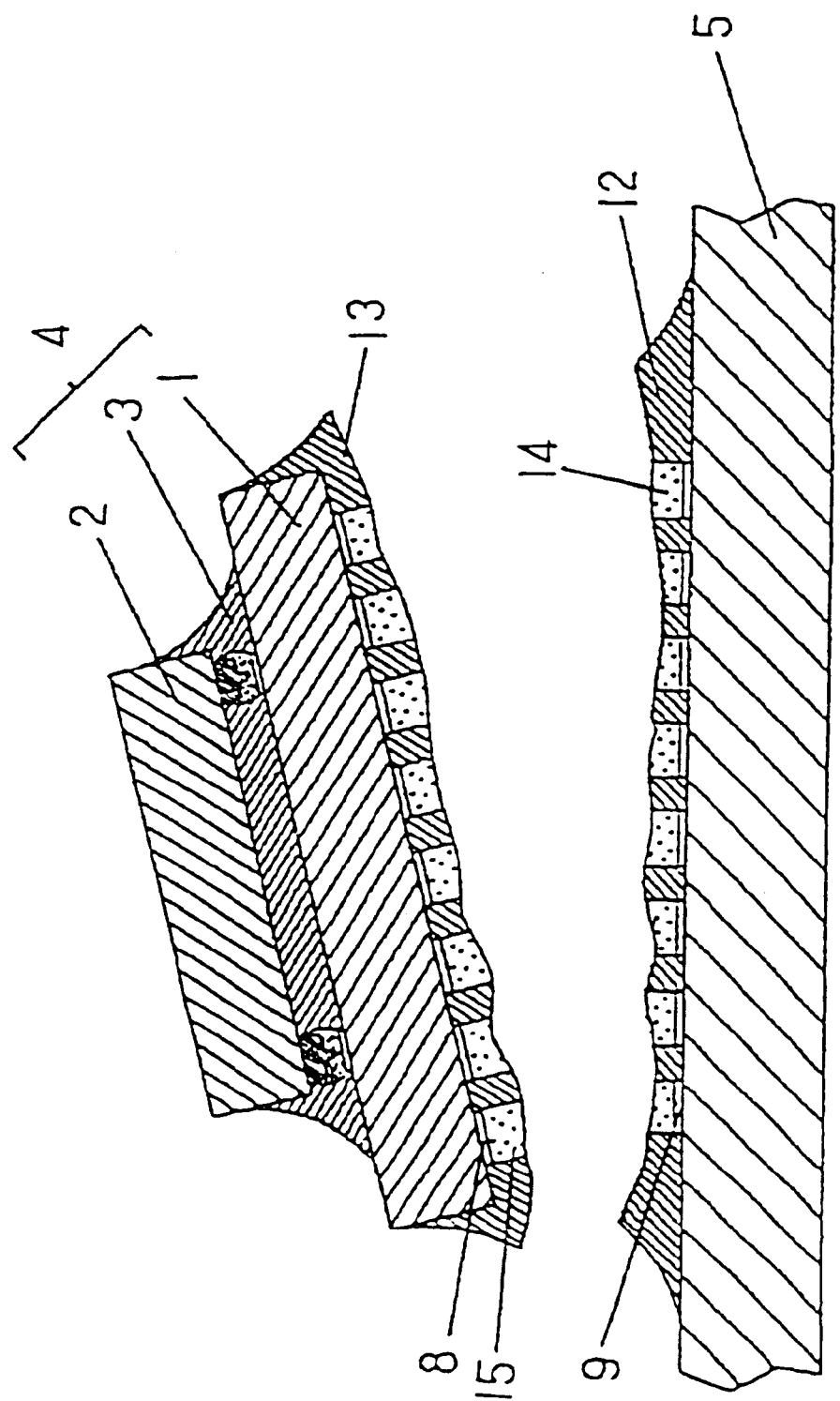
FIG. 2 depicts a cross-sectional view of a semiconductor device which has been removed from the circuit board for repairing purposes according to the present invention.

After the semiconductor device 4 is removed as shown in FIG. 2, a residue 12 of the cured reaction product of the thermosetting resin composition and a residue 14 of the solder are left on the circuit board 5. The residue of the cured reaction product of the thermosetting resin composition can be removed, for example, by scraping it off after the residue has been softened by heating it to a predetermined temperature, allowing it to swell with solvent, or allowing it to swell with solvent while heating it to a predetermined temperature.

The residue can be most easily removed by using both heating and solvent. For example, the residue can be scraped off after it has been softened by allowing the residual resin to swell with solvent while keeping the entire circuit board at a temperature of the order of 100° C. (usually in the range of 80 to 120° C.)

The solvent used for this purpose is one which causes the cured reaction products of the thermosetting resin composition to swell, thereby reducing bond strength to such an extent that the cured material can be scraped off from the circuit board. Useful solvents include organic ones, for example, alkyl chlorides such as methylene chlorlide; glycol ethers, such as ethyl cellulose and butyl cellulose; diesters of dibasic acids, such as diethyl succinate; and N-methylpyrrolidone. Of course, appropriate combinations may also be employed.

Where a circuit-protecting resist has already been applied to the circuit board, the chosen solvents should, cause no damage to the resist. Desirable solvents include glycol ethers and N-methylpyrrolidone.

The residue of the solder can be removed, for example, by use of a solder-absorbing braided wire.

Finally, on the circuit board which has been cleaned according to the above-described procedure, a new semiconductor device is mounted again in the same manner as described previously. Thus, the repair of the failure site is completed.

Where a failure is found in the circuit board, the semiconductor device can be reused by removing the residue 13 of the cured reaction product of the thermosetting resin composition and the residue 15 of the solder left on the bottom of the semiconductor device in the same manner as described above.

The invention will be further illustrated by the following non-limiting examples.

EXAMPLES

Example 1

Thermosetting Resin Composition

A thermosetting resin composition was prepared by mixing the epoxy resins (i), curing agents (ii) and plasticizer (iii) in the amounts described below, and 0.1 parts by weight of a defoaming agent. The viscosity of the so-formed composition was observed to be 5,200 MPa·s.

(i) epoxy resins: 85 parts by weight of bisphenol A type epoxy resin, 4 parts by weight of novolac epoxy resin, and 11 parts by weight of a mixture of alkyl glycidyl ethers of 12 to 14 carbon atoms.

(ii) curing agents: 3 parts by weight of dicyandiamide, and 19 parts by weight of an epoxy adduct of an amine.

(iii) plasticizer: 12 parts by weight of an acrylated amine oligomer.

Mounting Process

Using cream solder (PS1OR-350A-F92C; manufactured by Harima Chemicals, inc.), a CSP having a package of 20 mm square, an electrode diameter of 0.5 mm, an electrode pitch of 1.0 mm, and a carrier substrate made of alumina was mounted on a 1.6 mm thick glass-reinforced epoxy board having a circuit formed thereon.

Thereafter, the thermosetting resin composition was applied to the periphery of the CSP by means of a dispenser, and then cured by heating at 150° C. for a period of time of about 5 minutes. During this procedure, the thermosetting resin composition penetrated into the space between the semiconductor device and the circuit board before curing completely.

Heat Shock Test

Twenty-five samples prepared as described above were exposed to thermal cycling while maintaining the sample at a temperature of about −40° C. for a period of time of about 30 minutes, followed by an elevation in temperature to room temperature for a period of time of about 3 minutes, and thereafter a further elevation of temperature to about +80° C. for a period of time of about 30 minutes. After a predetermined number of thermal cycles was reached, the sample was subjected to a continuity test for confirming the electrical connection between the CSP and the circuit board. The sample was regarded as acceptable when continuity was confirmed at 1,000 cycles or more, and unacceptable when continuity was lost owing to broken lines or the like before this number of cycles was reached. As to the mounting structure of this example, all of the 25 samples were acceptable even at more than 1,000 cycles.

Repair

Using a hot air generator, the area around the CSP fixed to the circuit board with the thermosetting resin composition as described above was heated by applying hot air at 250° C. for 1 minute. Then, the CSP could be easily removed by inserting a metal piece between the CSP and the glass-reinforced epoxy board, and lifting the CSP.

While the glass-reinforced epoxy board was kept at about 100° C. by placing it on a hot plate (or by heating it with a far-infrared heater or the like), the resin left on the glass-reinforced epoxy board was allowed to swell with a solvent such as PS-1 (manufactured by Dai-ichi Kogyo Seiyaku Co., Ltd.) or 7360 (manufactured by Loctite Corporation), and then scraped off with a spatula. The solder left on the glass-reinforced epoxy board was removed by use of a solder-absorbing braided wire. The time required for this repairing operation was within 3 minutes, which was sufficiently short from a practical point of view.

Cream solder was applied again to the glass-reinforced epoxy board from which the CSP had been removed in the above-described manner, and a new CSP was mounted thereon. In this operation, cream solder may be printed on the new CSP.

In the same manner as described above, the thermosetting resin composition was applied to the periphery of the CSP and then cured by heating at 150° C. for 5 minutes.

In the CSP-mounted board so repaired, electrical connections were securely established. Also in a heat shock test, this mounting structure exhibited excellent properties similar to those of the unrepaired one.

Examples 2–5

The procedure of Example 1 was repeated except that the amount of the acrylated amine oligomer used as a plasticizer in Example 1 was altered as shown below. The resulting mounting structures passed a heat shock test, and their repair time was within 3 minutes.
Example 2: 1.2 parts by weight.
Example 3: 6.0 parts by weight.
Example 4: 21.0 parts by weight.
Example 5: 50.0 parts by weight.

Comparative Example 1

The procedure of Example 1 was repeated except that no plasticizer was used. The resulting mounting structure exhibited acceptable repairability, but did not pass a heat shock test because continuity was lost at less than 1,000 cycles.

Comparative Example 2

The procedure of Example 1 was repeated except that the amount of the acrylated amine oligomer used as a olasticizer in Example 1 was altered to 120 parts by weight. The resulting mounting structure exhibited acceptable repairability, but did not pass a heat shock test because continuity was lost at less than 1,000 cycles.

Examples 6–9

The procedure of Example 1 was repeated except that the amount of the mixture of alkyl glycidyl ethers of 12 to 14 carbon atoms used in Example 1 was altered as shown below. The resulting mounting structures passed a heat shock test, and their repair time was within 3 minutes.
Example 6: 0 part by weight.
Example 7: 2.7 parts by weight.
Example 8: 5.3 parts by weight
Example 9: 20.0 parts by weight.

Comparative Example 3

The procedure of Example 1 was repeated except that the amount of the mixture of alkyl glycidyl ethers of 12 to 14 carbon atoms used in Example 1 was altered to 40 parts by weight. The resulting mounting structure exhibited acceptable repairability, but did not pass a heat shock test because continuity was lost at less than 1,000 cycles.

Examples 10–12

The procedure of Example 1 was repeated except that the acrylated amine oligomer used as a plasticizer in Example 1 was replaced by each of the compounds shown below. The resulting mounting structures passed a heat shock test, and their repair time was within 3 minutes.
Example 10: DOP (dioctyl phthalate)
Example 11: Isobornyl acrylate.
Example 12: 2-Hydroxyethyl methacrylate.

Example 13

The procedure of Example 1 was repeated except that the epcxy adduct of amine used as a curing agent in Example 1 was replaced by the epoxy adduct of imidazole. The resulting mounting structure passed a heat shock test, and its repair time was within 3 minutes.

Comparative Example 4

The procedure of Example 1 was repeated except that, in place of the thermosetting resin composition used in Example 1, an adhesive (TB3OO6B; manufactured by Three Pond Co., Ltd.) comprising acrylate oligomers, acrylate monomers and a photopolymerization initiator was used and cured by exposure to light through the gap between the semiconductor device and the circuit board and by the application of heat. When this adhesive was used, the semiconductor device could be easily removed in its semicured state. After the adhesive was completely cured, the resulting mounting structure was subjected to a heat shock test. Its heat shock properties were unacceptable because continuity was lost at less than 1,000 cycles.

Comparative Example 5

The procedure of Example 1 was repeated except that in place of the thermosetting resin composition used in Example 1, an epoxy resin sealant (SA-51-2; manufactured by Asahi Kaken Co., Ltd.) was applied in the same manner as in Example 1 and cured by heating at 100° for 90 seconds. In a heat shock test, the resulting mounting structure exhibited the same degree of reliability as in Example 1. However, an attempt was made to separate the semiconductor device by the application of heat for repairing purposes, but in vain.

The full scope of the invention is measured by the claims. What is claimed is:

1. A mounting structure for semiconductor devices, comprising:

a semiconductor device comprising a semiconductor chip mounted on a carrier substrate, and a circuit board to which said semiconductor device is electrically connected, wherein the space between the carrier substrate of said semiconductor device and said circuit board is sealed with a reaction product of a thermosetting resin composition comprising about 100 parts by weight of an epoxy resin, about 3 to about 60 parts by weight of a curing agent and about 1 to about 90 parts by weight of a plasticizer.

2. The structure of claim 1, wherein said plasticizer is a member selected from the group consisting of (meth)acrylic esters, aromatic or aliphatic esters and combination thereof.

3. The structure of claim 1, wherein said curing agent is a member selected from the group consisting of amine compounds, imidazole compounds, modified amine compounds, modified imidazole compounds and combinations thereof.

4. The structure of claim 1, wherein said epoxy resin comprises at least one multifunctional epoxy resin and 0 to about 30% by weight based on the total weight of said epoxy resin of at least one monofunctional epoxy resin.

5. The structure of claim 4, wherein the combined amount of said plasticizer and said monofunctional epoxy resin is from about 5 to about 40% by weight of the total composition.

6. The structure of claim 4, wherein said monofunctional epoxy resin has an alkyl group having from about 6 to about 28 carbon atoms.

7. The structure of claim 4, wherein said multifunctional epoxy resin comprises about 10 to about 100% by weight of bisphenol A type epoxy resin.

8. The structure of claim 1, wherein said plasticizer is a (meth)acrylic ester of a hydroxy aliphatic amine.

9. The structure of claim 1, wherein said thermosetting resin composition has a viscosity of not greater than about 50,000 mpa·s at a temperature of 25° C.

10. A process for semiconductor devices, said process comprising the steps of:

electrically connecting a semiconductor device comprising a semiconductor chip mounted on a carrier substrate, to a circuit board;

infiltrating a thermosetting resin composition into the space between the carrier substrate of said semiconductor device and said circuit board, wherein the composition Comprising about 100 parts by weight of an epoxy resin, about 3 to about 60 parts by weight of a curing agent and about 1 to about 90 parts by weight of a plasticizer, and curing the thermosetting resin composition by the application of heat.

11. The process of claim 10, further comprising the steps of:

testing electrical properties of said circuit board on which said semiconductor device is mounted;

if a failure is found in said testing step, removing said semiconductor device at the failure site while heating the neighborhood of the failure site;

removing the residue of reaction product of the thermosetting resin composition left on said circuit board or on the bottom of said semiconductor device by heating it to a predetermined temperature, impregnating it with an organic solvent, or impregnating it with an organic solvent while heating it to a predetermined temperature; and removing the residue of the electrically conductive material left on said circuit board or on the bottom of said semiconductor device.

12. The process of claim 10, wherein said plasticizer comprises at least one compound selected from the group consisting of (meth)acrylic esters, aromatic or aliphatic esters and combination thereof.

13. The process of claim 10, wherein said curing agent comprises at least one compound selected from the group consisting of amine compounds, imidazole compounds, modified amine compounds, modified imidazole compounds and combinations thereof.

14. The process of claim 10, wherein said epoxy resin comprises at least one multifunctional epoxy resin and 0 to about 30% by weight based on the total epoxy resin of at least one monofunctional epoxy resin.

15. The process of claim 14, wherein the combined amount of said plasticizer and said monofunctional epoxy resin is from 5 to 40% by weight of the total composition.

16. The process of claim 14, wherein said monofunctional epoxy resin has an alkyl group having from about 6 to about 28 carbon atoms.

17. The process of claim 14, wherein said multifunctional epoxy resin comprises about 10 to about 100% by weight of bisphenol A type epoxy resin.

18. The structure of claim 10, wherein said plasticizer is a (meth)acrylic ester of a hydroxy aliphatic amine.

19. The process of claim 10, wherein said thermosetting resin composition has a viscosity of not greater than about 50,000 mpa·s at a temperature of 25° C.

* * * * *

UNITED STATES PATENT AND TRADEMARK OFFICE
CERTIFICATE OF CORRECTION

PATENT NO.    : 6,274,389 B1                                              Page 1 of 1
DATED         : August 14, 2001
INVENTOR(S)   : Kazutoshi et al.

It is certified that error appears in the above-identified patent and that said Letters Patent is hereby corrected as shown below:

<u>Title page,</u>
ABSTRACT,
Before "fixed" insert -- securely --, and after "circuit board" and before the ". (period)" insert the following: -- by short-time heat curing, which exhibits good productivity, and excellent heat shock properties (or thermal cycle properties), and which permits the semiconductor device to be easily removed from the circuit board in the event of failure --.

<u>Column 9,</u>
Line 67, change "olasticizer" to -- plasticizer --.

<u>Column 10,</u>
Line 39, change "epcxy" to -- epoxy --.

Signed and Sealed this

Ninth Day of July, 2002

*Attest:*

*Attesting Officer*

JAMES E. ROGAN
*Director of the United States Patent and Trademark Office*